(12) United States Patent
Cosijns et al.

(10) Patent No.: US 8,111,377 B2
(45) Date of Patent: Feb. 7, 2012

(54) LITHOGRAPHIC APPARATUS WITH AN ENCODER ARRANGED FOR DEFINING A ZERO LEVEL

(75) Inventors: Suzanne Johanna Antonetta Geertruda Cosijns, Casteren (NL); Andre Schreuder, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 485 days.

(21) Appl. No.: 12/351,563

(22) Filed: Jan. 9, 2009

(65) Prior Publication Data

US 2009/0180084 A1 Jul. 16, 2009

Related U.S. Application Data

(60) Provisional application No. 61/006,394, filed on Jan. 10, 2008.

(51) Int. Cl.
*G03B 27/42* (2006.01)
(52) U.S. Cl. .................. 355/53; 355/72; 355/75
(58) Field of Classification Search ............ 355/18, 355/53, 67, 69, 72, 77, 75; 378/34, 35; 250/492.1, 250/492.2, 492.21, 492.22; 256/399–401, 256/450, 496, 498–500, 508–510; 356/399–401, 356/450, 496, 498–500, 508–510
See application file for complete search history.

(56) References Cited

U.S. PATENT DOCUMENTS 5,680,211 A * 10/1997 Kaneda et al. ................ 356/499
2006/0023178 A1 * 2/2006 Loopstra et al. ................ 355/53

* cited by examiner

*Primary Examiner* — Hoon Song
*Assistant Examiner* — Mona M Sanei
(74) *Attorney, Agent, or Firm* — Pillsbury Winthrop Shaw Pittman LLP

(57) ABSTRACT

A lithographic apparatus includes a position measuring system configured to measure a position of a moveable object with respect to a reference frame of the lithographic apparatus, in at least one direction of an orthogonal x-y-z coordinate system of the moveable object. The position measuring system includes an optical x-z-encoder configured to measure a displacement of a radiation source, a first grating, and a detector with respect to a second grating of the encoder. The first grating includes an alignment marker. A controller is configured to define a zero level of the moveable object with respect to the reference frame in at least one of the x- and z-direction by performing the scanning along the first grating, the alignment marker during the scanning step causing changes in the phase of the response of both the first positive and negative orders.

19 Claims, 4 Drawing Sheets

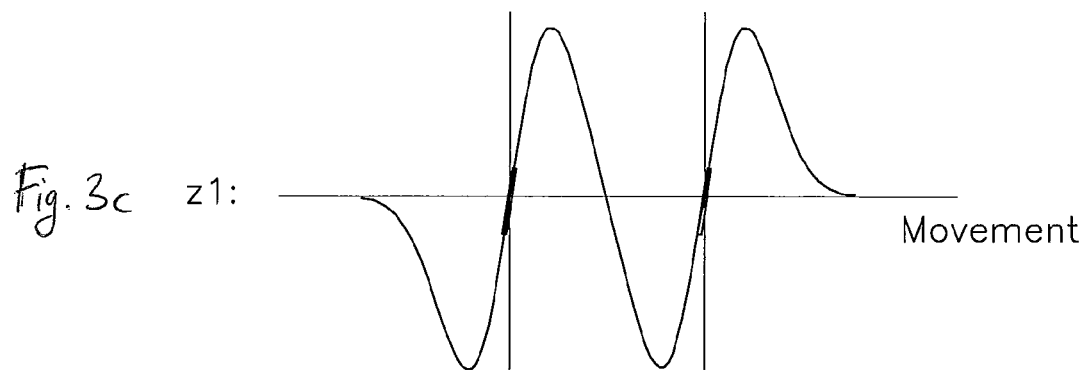
Fig. 3c  z1:                                           Movement
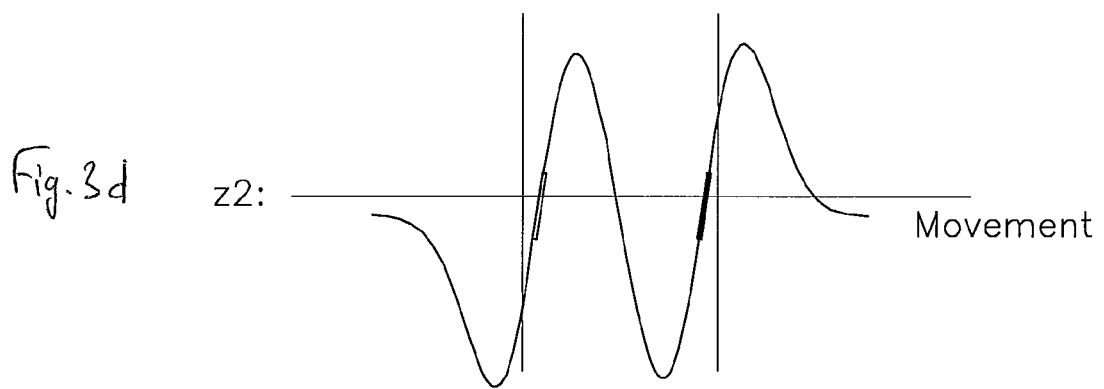
Fig. 3d  z2:                                           Movement
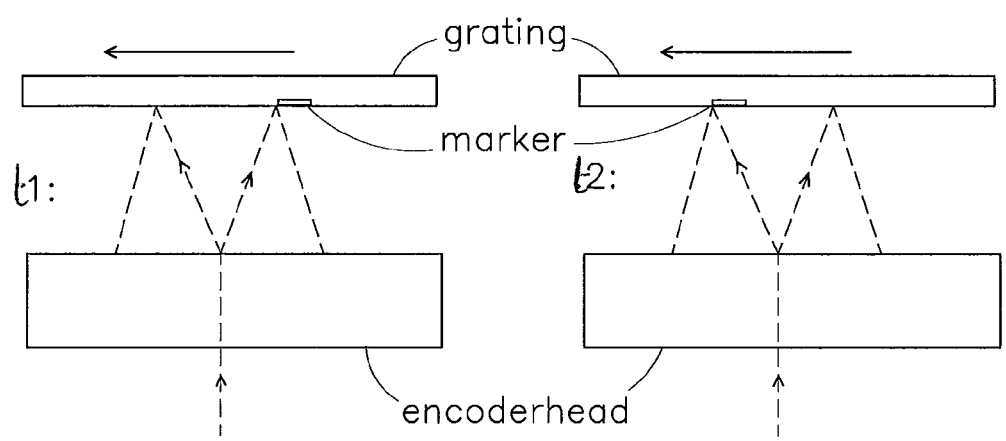
Fig 3a                                           Fig 3b

LITHOGRAPHIC APPARATUS WITH AN ENCODER ARRANGED FOR DEFINING A ZERO LEVEL

CROSS-REFERENCE TO RELATED APPLICATIONS

This application claims priority and benefit under 35 U.S.C. §119(e) to U.S. Provisional Patent Application No. 61/006,394, entitled "Lithographic Apparatus With An Encoder Arranged For Defining A Zero Level", filed on Jan. 10, 2008. The content of that application is incorporated herein in its entirety by reference.

FIELD

The present invention relates to a lithographic apparatus with a position measuring system and to a method using such a position measuring system.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus generally includes a motion control system. This motion control system includes position detectors configured to detect a position of, for example, a substrate table of the lithographic apparatus in at least one plane, i.e. in at least two dimensions. Further the motion control system includes a controller which is constructed to drive actuators in dependency on an output signal provided by the position detectors. The motion control system forms part of a feed forward and/or feed back control system ensuring that the table is in a correct position within a certain tolerance range. A position of the table is each time detected by the position detectors, and a difference between the detected position and a desired position is reduced by an appropriate action of the controller.

In a current lithographic apparatus, a desired accuracy for the table is in the order of magnitude of nanometers. Hence, it is desired that the position detector be able to achieve such a high accuracy. Furthermore, requirements on the position detector are also high in that the range within which the position detector generally operates is relatively large (e.g. up to 0.5 m for the substrate table). The known position detectors include interferometers. Interferometers, however, may be expensive.

A further type of position detector is an optical encoder. Such an optical encoder includes a light or radiation source, a grating and a detector. By moving the grating with respect to the radiation source and the detector, changes occur in the radiation pattern as received by the detector due to e.g. reflection or transmission changes. The grating is thus included in an optical path from the radiation source to the detector. If the grating is moved, the pattern as received by the detector changes. From these changes, displacement of the grating with respect to the radiation source and detector can be calculated. From a known starting position and a calculated displacement, an absolute position can be calculated. Since encoders are not always absolute sensors, it is desirable to measure a zero position by an additional sensor.

A specific type of optical encoder includes a diffraction type encoder including a radiation source, a first grating, a second grating, and a detector. The second grating is moveable with respect to the first grating, and the detector is arranged to detect a diffracted beam of the radiation beam as diffracted on the first and the second grating. One of the gratings is mechanically connected to the substrate table, the other one of the gratings is mechanically connected to a reference frame of the lithographic apparatus. A movement of the substrate table causes a movement of the first grating with respect to the second grating and in operation causes a change in the diffracted beam.

Measurements of the substrate table in z-direction, that is to say a direction perpendicular to the x-y plane of movement of the substrate table, is also done with the aid of encoders. Also, such a diffraction type encoder is not an absolute sensor, and for measuring and defining a zero position an additional sensor may be used.

Patterning device stage position measurement in z-direction is done with capacitive sensors. These are absolute sensors. However, present capacity sensors are not able to reach sufficient accuracy. In particular, a lower noise and vacuum compatibility is desirable. Using a 2 D encoder head may provide an improvement in this matter, but may lack an absolute zero position in z-direction.

SUMMARY

It is desirable to provide a position measuring system of a lithographic apparatus with which a zero level in z-direction can be accurately defined without having to use expensive and/or additional sensors.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a position measuring system configured to measure a position of a moveable object with respect to a reference frame of the lithographic apparatus, in at least one direction of an orthogonal x-y-z coordinate system centered on the moveable object, the position measuring system including at least one optical x-z-encoder configured to measure displacements of a radiation source, a first grating, and a detector with respect to a second grating of the encoder, the radiation source, the detector and the second grating being mounted on one of the moveable object and the reference frame, and the first grating being provided on the other one of the moveable object and the reference frame, in which the encoder is configured to, during scanning along the first grating, split a beam of radiation coming from the radiation source into at least a first positive and negative order of the beam reflected, each order having an angle with respect to the gratings and resulting in a response on the detector which is diffracted ad reflected by the gratings, wherein the first grating includes at least one alignment marker, and wherein a controller is provided which is configured to define a zero level of the moveable object with respect to the reference frame in at least one of the x- and z-direction by performing the scanning along the first grating, the alignment marker during the scanning step causing changes in the phase of the response of both the first positive and negative orders.

In another embodiment of the invention, there is provided a position measuring system configured to measure a position of a moveable object with respect to a reference frame of an apparatus, in at least one direction of an orthogonal x-y-z coordinate system centered on the moveable object, the position measuring system including at least one optical x-z-encoder configured to measure displacements of a radiation source, a first grating, and a detector with respect to a second grating of the encoder, the radiation source, the detector and the second grating being mounted on one of the moveable object and the reference frame, and the first grating being provided on the other one of the moveable object and the reference frame, in which the encoder is configured to, during scanning along the first grating, split a beam of radiation coming from the radiation source into at least a first positive and negative order of the beam reflected, each order having an angle with respect to the gratings and resulting in a response on the detector which is diffracted and reflected by the gratings,
wherein the first grating includes at least one alignment marker, and wherein a controller is provided which is configured to defining a zero level of the moveable object with respect to the reference frame in at least one of the x- and z-direction by performing the scanning along the first grating, the alignment marker during the scanning causing changes in the phase of the response of both the first positive and negative orders.

According to a further embodiment of the invention, there is provided a method for defining a zero level in at least one of the x-, y- or z-direction using the abovementioned position measuring system, including performing a scanning along the first grating; and defining a zero level of the moveable object with respect to the reference frame in at least one of the x- and z-direction by during the scanning step measuring changes in the phase of the response of both the first positive and negative orders.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 3a and 3b depict the optical encoder of FIG. 2 during performance of the scanning procedure;

FIGS. 3c and 3d show the measurements at height z1 and z2, respectively; and

DETAILED DESCRIPTION

Figure 1:
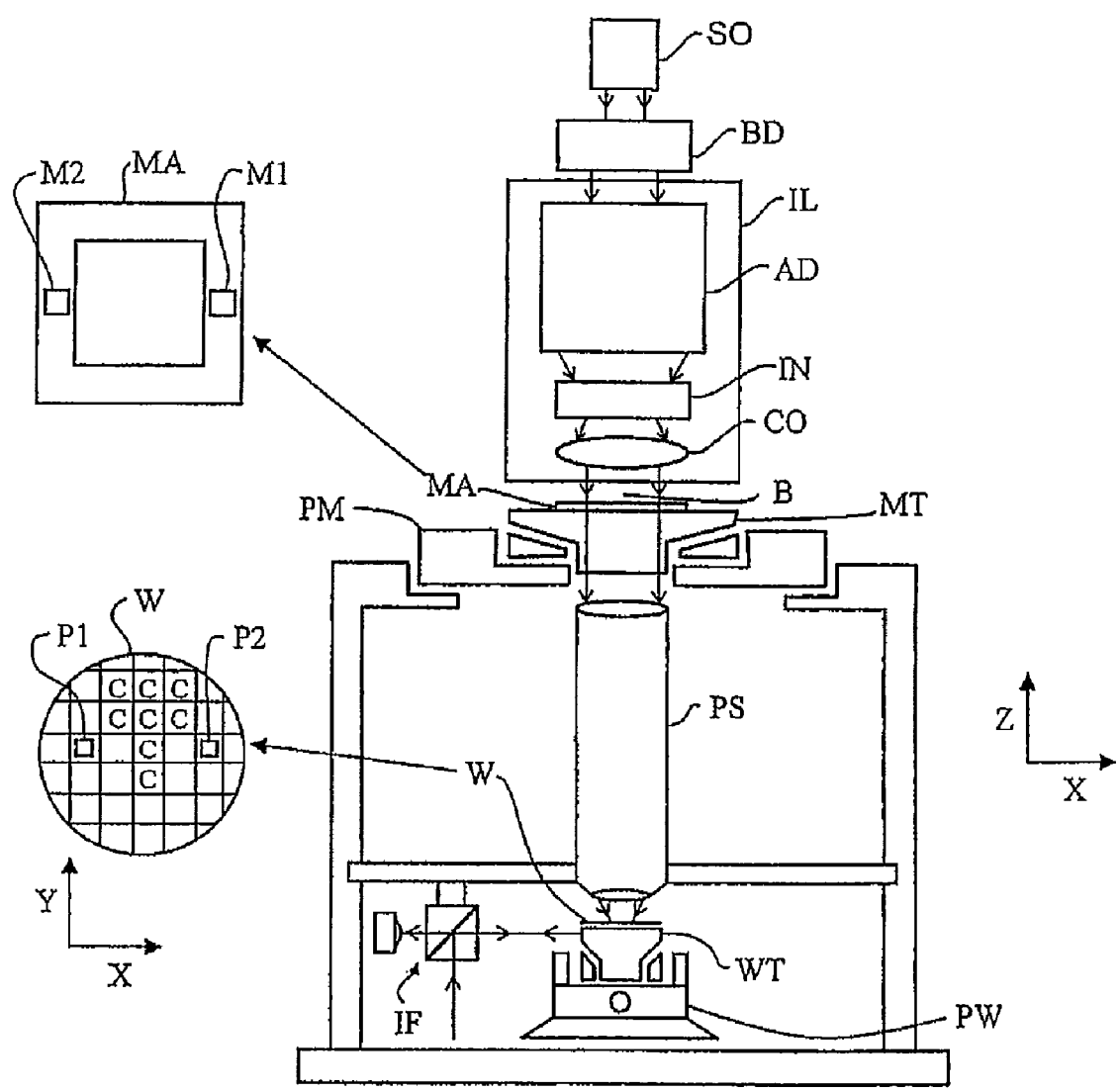
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support structure or patterning device support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
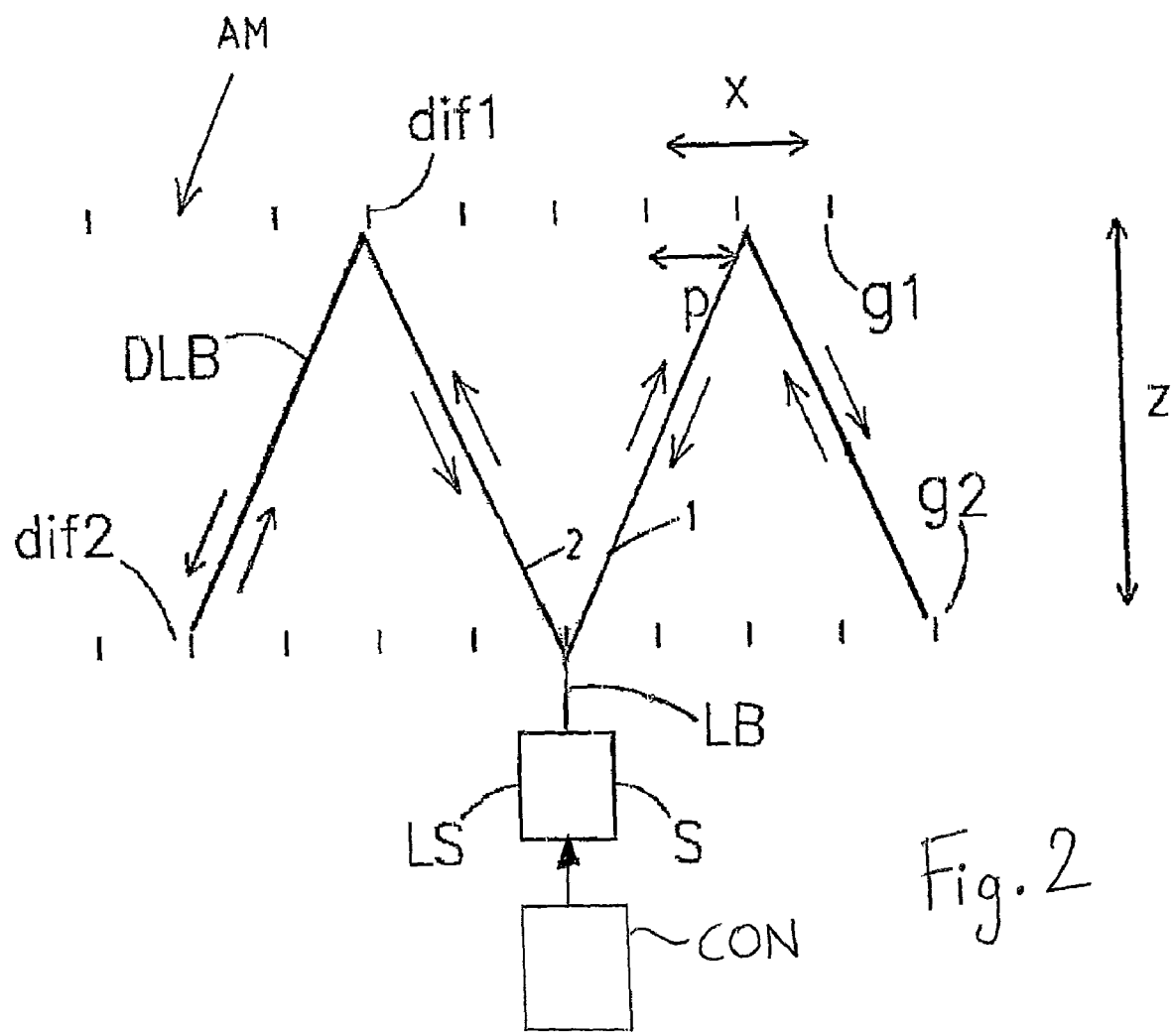
FIG. 2 schematically depicts an exemplary embodiment of an optical encoder of the lithographic apparatus according to an embodiment of the invention.

In FIG. 2, a position detector according to an embodiment of the present invention is shown, which may form part of a position measuring system according to an embodiment the present invention, for example, a position measuring system arranged to measure a position of the patterning device support (e.g. mask table) MT with respect to a reference frame of the lithographic apparatus in FIG. 1.

This position detector includes an x-z encoder of the incremental type, and has a first grating g1 and a second grating g2. The gratings are positioned substantially parallel to each other. The detector further includes a radiation source S which generates a beam of radiation LB. The beam of radiation LB is split into at least a first positive and negative order 1, 2 respectively, each having an angle with respect to the gratings g1, g2 in a different direction. Each order 1, 2 of the beam of radiation LB generates, when incident on the first grating g1, a diffraction pattern, schematically indicated by dif1, thus generating a diffracted radiation beam DLB. The diffracted radiation beam DLB again creates a diffraction pattern dif2 on the second grating g2, a part of the incident radiation of both orders 1, 2 of the beam of radiation LB traveling along a same path back to the source S.

To detect the diffracted, received radiations, the source S is combined with a radiation sensor LS configured to detect the radiations which have been diffracted twice, i.e. on the first grating g1 and the second grating g2, and are received back by the radiation sensor LS.

In an embodiment, the source S, the radiation sensor LS and the second grating g2 are mounted on the reference frame. The first grating g1 is provided on the patterning device support (e.g. mask table) MT.

When a movement of the patterning device support (e.g. mask table) MT takes place (e.g. a relative movement between the patterning device support and the reference frame), the first grating g1 is moved with respect to the second grating g2. This movement, in the example depicted in FIG. 2, takes place in the direction indicated by x.

Upon a movement in the direction indicated by x, the diffraction patterns of both orders 1, 2 of the light beam LB on the first grating g1 and the second grating g2 change. This results in a change in the radiation received back by the radiation sensor LS. When the first grating g1 and the second grating g2 are moved with respect to each other by a distance equal to a pitch p of the grating, a same diffraction pattern occurs, thus a same amount of radiation is received by the light sensor LS. Thus periodic changes in the diffraction pattern upon movement of the gratings with respect to each other results in a periodic change of the radiation received back by the radiation sensor LS.

In FIG. 2 the gratings are schematically indicated by lines, which will provide an adequate solution for the x-z encoder.

Figure 4:
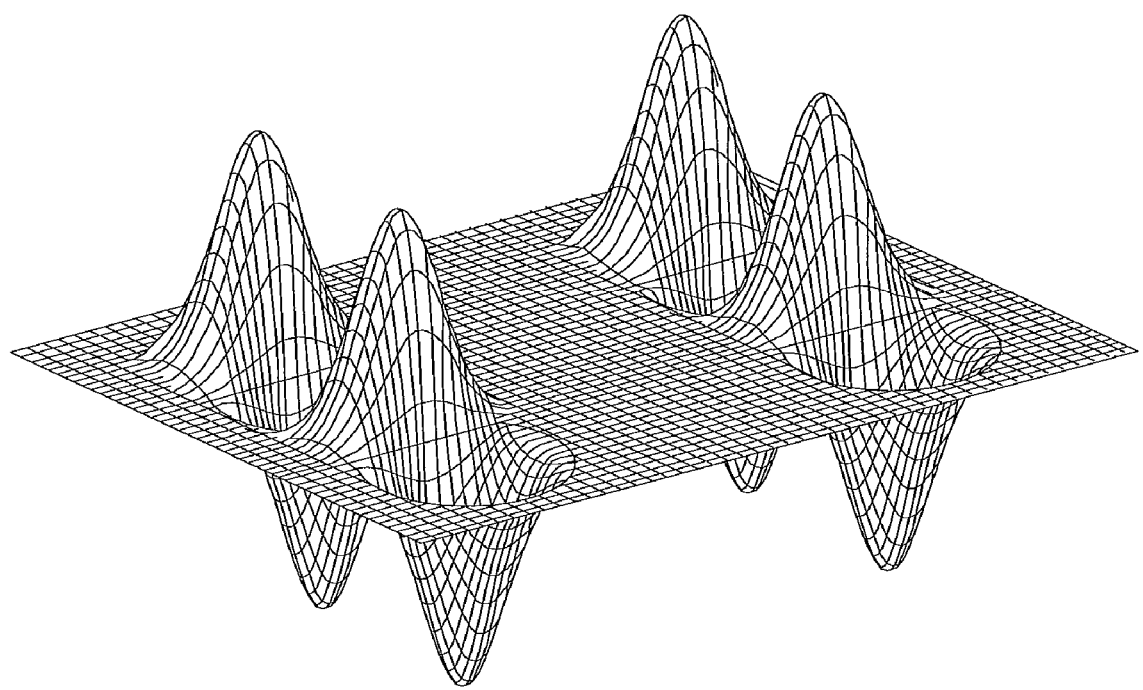
FIG. 4 shows a response of the optical encoder during scanning, according to an embodiment of the present invention.

The first grating g1 includes an alignment marker AM, which here is formed by a space between the lines. Furthermore, a controller CON is provided which is configured to define a zero level of the patterning device support (e.g. mask table) MT with respect to the reference frame in both x- and z-direction. This is achieved by the controller having the encoder perform a scanning procedure along the first grating g1. The alignment marker AM causes changes in the periodic diffraction patterns when the alignment marker first passes the first positive order 1 of the beam of radiation LB (see FIG. 3a) and secondly passes the first negative order 2 of the beam of radiation LB (see FIG. 3b). An example of these changes can clearly be seen in FIG. 4.

The abovementioned changes caused by the alignment marker AM passing the two orders 1, 2 of the light beam, may be used to define an absolute zero reference in the x-z encoder, i.e. both in x-direction and in z-direction. Beneficially, according to an embodiment of the invention, accuracy in defining the zero level of 1 µm or less might be achieved.

In an embodiment of the invention, the distance between the two abovementioned changes of the beam of radiation reflected from the alignment marker AM is measured.

By performing more than one scan along the alignment marker AM at various heights (distances between the source S, the radiation sensor LS and the second grating g2 with respect to the first grating g1), the measured distance between the first order and the second order changes as the beams have an angle with respect to the gratings. FIGS. 3c and 3d show the measurements at height z1 and z2, respectively. The theoretical distance between the measured alignment marker AM in focus (middle of the z-range) may, for example, be chosen as zero level. This may be accurately found (submicron) by the above procedure and locked as zero position in a calibration procedure. The response per encoder for the x-signal and the z-signal are equal with respect to their behaviour but differ with respect to each other in amplitude. This makes it possible to distinguish them from each other and define the zero level both in x and z-direction for the encoder. By performing the scan in two heights, the desired information may be obtained in an accurate way.

The bandwidth of the control loop during zeroing should be considerably lower, in particular at least more than two times, compared to the control bandwidth during use of the system in scan mode. A low bandwidth movement over the grating may give a measurement trigger on the marker position at t1 (FIG. 3a) and a second trigger on the marker position at t2 (FIG. 3b). More in particular the relatively low bandwidth is such that the servo system may not react. Even more in particular the bandwidth is such that the following equation goes:

$$v/d > 2*\text{bandwidth};$$

v=relative speed between the movable object and the reference frame, and d=measurement of the marker.

Due to the known relation between the two branches in the encoder, the position difference between t1 and t2 together with the output angle of both orders 1, 2 of the light beam LB can be related to a position of the alignment marker AM compared to the light sensor LS.

With respect to timing it is stated that the above method for defining the zero level may be performed for initialization and possibly before each reticle load. The time desired to perform the method may not take more than one second. During lot operation with the same patterning device, zeroing may only take place once after loading.

In an embodiment, the alignment marker AM preferably has dimensions which are more than 10 times smaller than a diameter of the beam of radiation coming from the radiation source during performance of the scanning for defining the zero level. These smaller dimensions only have to count in one direction, for example when the alignment marker is a stripe having a thickness at least 10 times smaller than the diameter of the beam of radiation.

The distance between the gratings, i.e. the distance along the direction indicated by z in FIG. 2 may vary over a large range. The gratings may thus be positioned on a short distance relative to each other, however they may also be positioned tens of centimeters, or even 0.5 m apart.

The direction indicated by z corresponds to, for example a direction perpendicular to the x-y plane of movement of the patterning device support (e.g. mask table) MT.

In addition to the embodiments shown hereinabove, it will be appreciated that numerous variant embodiments may be possible. For example, in an embodiment of the invention, 3-dimensional x-y-z encoders, for example x-y-z encoders which use a common set of gratings for the x and y direction, may be used. Further, instead of using two alignment markers that are spaced part, a deviation from the pattern of the grating, for example a local different line pattern of the grating, could also be used to define the zeroing. In an embodiment of the invention, the concepts defined hereinabove may be implemented outside the field of lithography as generic add on to z-encoder technology in general. Further, in order to define the zero level for both the x- and z-direction, it is also possible to define only one of them. An embodiment of the invention may also be used for absolute reference in x-y directions. Furthermore, an embodiment of the invention may also be used for other movable objects, within or outside the field of lithography, such as, for example, the substrate stage WS of a lithographic apparatus. This may also remove the need of a separate zero sensor hardware.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
an illumination system configured to condition a first beam of radiation;
a support constructed to support a patterning device, the patterning device being capable of imparting the first beam of radiation with a pattern in its cross-section to form a patterned radiation beam;
a substrate table constructed to hold a substrate;
a projection system configured to project the patterned radiation beam onto a target portion of the substrate;
a position measuring system configured to measure a position of a moveable object with respect to a reference frame of the lithographic apparatus, in at least one direction of an orthogonal x-y-z coordinate system of the moveable object, the position measuring system comprising
an optical x-z-encoder configured to measure a displacement of a radiation source, a first grating, and a detector with respect to a second grating of the encoder, the radiation source, the detector and the second grating mounted on one of the moveable object or the reference frame, and the first grating arranged on the other one of the moveable object or the reference frame,
wherein the encoder is configured to, during scanning along the first grating, split a second beam of radiation coming from the radiation source into at least a first positive and a first negative order of the second beam of radiation, each of the first positive and the first negative order having an angle with respect to the first and the second grating and resulting in a response on the detector which is diffracted by the first and the second grating,
wherein the first grating comprises an alignment marker; and
a controller configured to define a zero level of the moveable object with respect to the reference frame in at least one of the x- and z-direction by performing the scanning along the first grating, the alignment marker during the scanning causing a change in a phase of the response of both the first positive and negative orders.

2. A lithographic apparatus according to claim 1, wherein the controller is configured to perform two scanning along the first grating during defining the zero level.

3. A lithographic apparatus according to claim 2, wherein the controller is configured to perform two scanning at different distances in z-direction between the movable object and reference frame.

4. A lithographic apparatus according to claim 1, wherein the controller is configured to define the zero level of the moveable object with respect to the reference frame in both the x- and z-direction by performing the scanning along the first grating, and differentiating the changes in the response for the x-direction from the changes in the response for the z-direction based on an amplitude of the response for the x-direction and an amplitude of the response for the z-direction.

5. A lithographic apparatus according to claim 1, wherein the alignment marker has dimensions which are more than 10 times smaller than a diameter of the second beam of radiation coming from the radiation source during the scanning for defining the zero level.

6. A lithographic apparatus according to claim 1, wherein a control loop during the scanning for defining the zero level has a bandwidth which is at least two times smaller than a bandwidth of a control loop during a subsequent scanning for measuring displacements of the movable object with respect to the reference frame.

7. A lithographic apparatus according to claim 1, wherein the first grating comprises a regular line pattern including an irregular part, the irregular part being at a position of the alignment marker.

8. A lithographic apparatus according to claim 7, wherein the irregular part is a spaced part without lines.

9. A lithographic apparatus according to claim 1, wherein the first grating is arranged on the movable object and wherein the radiation source, detector and second grating are arranged on the reference frame.

10. A lithographic apparatus according to claim 1, wherein the moveable object is the support configured to support the patterning device.

11. A lithographic apparatus according to claim 1, wherein the moveable object is the substrate table.

12. A position measuring system configured to measure a position of a moveable object with respect to a reference frame of an apparatus, in at least one direction of an orthogonal x-y-z coordinate system of the moveable object, the position measuring system comprising:
    an optical x-z-encoder configured to measure a displacement of a radiation source, a first grating, and a detector with respect to a second grating of the encoder, the radiation source, the detector and the second grating mounted on one of the moveable object or the reference frame, and the first grating arranged on the other one of the moveable object or the reference frame,
        wherein the encoder is configured to, during scanning along the first grating, split a beam of radiation coming from the radiation source into at least a first positive and a first negative order of the beam of radiation, each of the first positive and the first negative order having an angle with respect to the first and the second grating and resulting in a response on the detector which is diffracted by the first and the second grating, wherein the first grating comprises an alignment marker; and
    a controller configured to define a zero level of the moveable object with respect to the reference frame in at least one of the x- and z-direction by performing the scanning along the first grating, the alignment marker during the scanning causing a change in the phase of the response of both the first positive and negative orders.

13. A position measuring system of claim 12, wherein the apparatus is a lithographic apparatus and the moveable object is a support configured to support a patterning device in the lithographic apparatus.

14. A position measuring system of claim 12, wherein the apparatus is a lithographic apparatus and the moveable object is a substrate table of the lithographic apparatus.

15. A position measuring system of claim 12, wherein the controller is configured to perform two scanning along the first grating during defining the zero level.

16. A position measuring system of claim 15, wherein the controller is configured to perform two scanning at different distances in z-direction between the movable object and reference frame.

17. A method for defining a zero level in at least one of the x-, y- or z-direction of an orthogonal x-y-z coordinate system using a position measuring system comprising an optical x-z-encoder configured to measure a displacement of a radiation source, a first grating, and a detector with respect to a second grating of the encoder, the radiation source, the detector and the second grating mounted on one of a moveable object or a reference frame, and the first grating arranged on the other one of the moveable object or the reference frame, the encoder configured to, during scanning along the first grating, split a beam of radiation coming from the radiation source into at least a first positive and a first negative order of the beam of radiation, each of the first positive and the first negative order having an angle with respect to the first and the second grating and resulting in a response on the detector which is diffracted by the first and the second grating, the first grating comprising an alignment marker, the method comprising:
    scanning the beam of radiation along at least part of the first grating; and
    defining a zero level of the moveable object with respect to the reference frame in at least one of the x- and z-direction by, during the scanning, measuring changes in a phase of the response of both the first positive and negative orders.

18. A position measuring system of claim 12, wherein the first grating comprises a regular line pattern including an irregular part, the irregular part being at a position of the alignment marker.

19. A method according to claim 17, wherein the first grating comprises a regular line pattern including an irregular part, the irregular part being at a position of the alignment marker.

* * * * *